(12) United States Patent
Bancel et al.

(10) Patent No.: US 9,077,334 B2
(45) Date of Patent: *Jul. 7, 2015

(54) COUNTERMEASURE METHOD AND DEVICE FOR PROTECTING DATA CIRCULATING IN AN ELECTRONIC COMPONENT

(75) Inventors: Frederic Bancel, Senas (FR); Philippe Roquelaure, Bouc Bel Air (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 254 days.

This patent is subject to a terminal disclaimer.

(21) Appl. No.: 13/608,904

(22) Filed: Sep. 10, 2012

(65) Prior Publication Data

US 2013/0002302 A1 Jan. 3, 2013

Related U.S. Application Data

(63) Continuation of application No. 12/973,391, filed on Dec. 20, 2010, now Pat. No. 8,330,495.

(30) Foreign Application Priority Data

Dec. 24, 2009 (FR) .................................... 09 06352

(51) Int. Cl.
*H03K 19/20* (2006.01)
*H03K 19/003* (2006.01)
(52) U.S. Cl.
CPC .................................. *H03K 19/003* (2013.01)
(58) Field of Classification Search
None
See application file for complete search history.

(56) References Cited

U.S. PATENT DOCUMENTS

| 6,133,761 | A | 10/2000 | Matsubara | |
|---|---|---|---|---|
| 2004/0028234 | A1* | 2/2004 | Wuidart | 380/287 |
| 2007/0250749 | A1* | 10/2007 | Lin et al. | 714/738 |
| 2008/0021940 | A1* | 1/2008 | Suzuki et al. | 708/200 |

FOREIGN PATENT DOCUMENTS

| DE | 103 44 647 B3 | 2/2005 |
|---|---|---|
| DE | 10 2005 037 355 B3 | 12/2006 |
| WO | 01/55821 A2 | 8/2001 |

OTHER PUBLICATIONS

French Search Report and Written Opinion dated Nov. 10, 2010, for French Application No. 0906352, 6 pages.

* cited by examiner

*Primary Examiner* — Jany Richardson
(74) *Attorney, Agent, or Firm* — Seed IP Law Group PLLC

(57) ABSTRACT

A countermeasure in a logic circuit having a logic gate supplying a binary output signal, the method including supplying binary data having random values to inputs of logic circuit during a precharge phase; supplying data to process to inputs of the logic circuit during a data processing phase; supplying on input of the logic circuit a precharge command signal launching a precharge phase; and under the effect of the precharge command signal, adapting the functioning of a logic gate of the logic circuit, statistically unbalanced, so that the output signal of the logic gate is in a binary state with a same probability as the random binary data supplied on input of the logic circuit during the precharge phase.

20 Claims, 4 Drawing Sheets

COUNTERMEASURE METHOD AND DEVICE FOR PROTECTING DATA CIRCULATING IN AN ELECTRONIC COMPONENT

BACKGROUND

1. Technical Field

The present disclosure relates to a countermeasure method for protecting sensitive data processed in an electronic component, against attacks aiming to discover these data. It also relates to a portable device with a microcircuit such as a chipcard, implementing the method.

Sensitive data can be, for example, encryption or decryption keys. More generally, it may be cryptographic data used or developed during cryptographic calculations, such as intermediary data of such calculations, and identifiers that are kept secret.

2. Description of the Related Art

Microcircuit devices manipulating sensitive data are sometimes the objects of attacks aiming to determine these data. Among the known types of attacks, Simple Power Analysis SPA or Differential Power Analysis DPA type attacks comprise measuring input and output currents and voltages of the microcircuit during the execution of a program by the microcircuit, with the goal of deducing the protected data used or processed by the microcircuit. With this same goal, attacks of the Electromagnetic Analysis EMA type are based on the analysis of the electromagnetic radiation emitted by the microcircuit. For example, the switching of logic gates causes electrical current consumption and electromagnetic radiation of the circuit. By detecting these variations, it may be possible to determine the data on input or output of logic gates.

Also known are fault injection attacks that consist of introducing perturbations in the microcircuit while it is executing sensitive algorithms such as cryptographic algorithms, or with the aim of launching a downloading routine of the data onto a port, which it then stores. Such a disturbance may be done by applying one or more brief lightings or voltage peaks on one of the contacts of the microcircuit.

BRIEF SUMMARY

The various attacks may be combined, for example to exploit statistical imbalances that notably appear in certain basic logic gates such as gates of the AND, NAND, OR, and NOR types. Indeed, considering a logic gate of the AND type, random binary data having a probability equal to ½ to be at the state of 0 or 1 are supplied on the inputs. Statistically, and taking into account the truth table of the logical AND function, the output of the gate will be at the state 0 with a probability of ¾ and at the state 1 with a probability of ¼. In the case of an OR type logic gate, the output of the gate will be at state 1 with a probability of ¾, and at the state 0 with a probability of ¼. In contrast, EXCLUSIVE OR (XOR) type logic gates (inverted or direct) and transfer (or buffer) gates will be statistically balanced because their outputs have a probability of ½ to be at 0 or 1 if they receive on input random binary data (with a probability of ½ to be at 0 or 1).

To protect a logic circuit against attacks of the SPA, DPA or EMA type, it is known to provide a logic circuit precharge phase before each data processing phase. During each precharge phase, random binary data are supplied on input of the logic circuit in order to randomly launch switches of gates in the logic circuit. Nevertheless, if during a processing phase, an AND type logic gate receives input data both at 1, the output of the gate goes to 1 by switching from 0 to 1 with a probability of ¾. This is because the output of the gate had a probability of ¾ to be at 0 after the precharge phase. If the data to process, supplied to the AND gate are respectively 0 and 1 or are both 0, the output of the gate goes to 0 by switching from 1 to 0 with a probability of ¼, because the output of the gate had a probability of ¼ to be at 1 after the precharge phase. Similar observations can be made for logic gates of NAND, OR, and NOR types.

It results that even with the performance of a precharge, a logic circuit can present an average number of logic gate switches depending only on the values of data to process, supplied on input of the circuit during the processing phase. The switching of logic gates of a logic circuit thus generates an information leak that may be exploited by SPA, DPA, or EMA attacks, which may be combined.

One embodiment relates to a countermeasure method in a logic circuit comprising a logic gate supplying a binary output signal, the method comprising steps of supplying binary data having random values to inputs of the logic circuit during a precharge phase, and supplying data to process to inputs of the logic circuit during a data processing phase. According to an embodiment, the method comprises steps of: supplying on input of the logic circuit a precharge command signal launching a precharge phase; and under the effect of the precharge command signal, adapting the functioning of a logic gate of the logic circuit, statistically unbalanced, so that the output signal of the logic gate is in a binary state with a probability of the random binary data supplied on input of the logic circuit during the precharge phase.

According to one embodiment, all the inputs except one of the logic gate are forced to a certain forced value, under the effect of the precharge command signal, to change the logic gate into a buffer or inverting gate.

According to one embodiment, the method comprises a step of providing a multiplexer for each input of the logic gate except one, connected on output to the input of the logic gate and receiving on one input an input data of the logic gate and on another input the forced value, and on a command input the precharge command signal.

According to one embodiment, under the effect of the precharge command signal, all the inputs except one of the logic gate are deactivated and the logic gate is changed into a buffer or inverter gate for the non-deactivated input.

According to one embodiment, the method comprises a step of short-circuiting transistors except one of the logic gate interconnected in series and controlled by the inputs of the logic gate, and of disconnecting transistors except one of the logic gate interconnected in parallel and commanded by the inputs, under the effect of the precharge command signal.

According to one embodiment, the logic gate is a gate of the AND, NAND, OR, or NOR type.

According to one embodiment, each of the logic gates of the logic circuit, presenting a statistically-unbalanced functioning, is modified so that the output signal of the logic gate is in a binary state with a same probability as the random binary data supplied on input of the logic circuit, under the effect of the precharge command signal.

An embodiment also relates to a countermeasure device in a logic circuit comprising a logic gate supplying a binary output signal. According to an embodiment, the device is configured to implement the method defined above.

According to one embodiment, the logic gate comprises a multiplexer for each input of the logic gate except one, connected on output to the input of the logic gate and receiving on one input an input data of the logic gate, on a control input the precharge command signal, and on another input a forced value changing the logic gate into a buffer or inverting gate.

According to one embodiment, the logic gate is configured to deactivate all the inputs except one of the logic gate and to change into a buffer or inverting gate for the non-deactivated input, under the effect of the precharge command signal.

According to one embodiment, the logic gate comprises transistors interconnected in series to the output of the logic gate and each controlled by an input of the logic gate, transistors interconnected in parallel to the output of the logic gate and each controlled by an input of the logic gate, a transistor controlled by the precharge command signal short-circuiting all the transistors interconnected in series except one when the precharge command signal is active, and a transistor controlled by the precharge command signal disconnecting all the transistors interconnected in parallel except one when the precharge command signal is active.

According to one embodiment, the logic gate is a gate of the AND, NAND, OR, or NOR type.

According to one embodiment, each of the logic gates of the logic circuit, presenting a statistically unbalanced functioning, is modified so that the output signal of the logic gate is in a binary state with a same probability as the random binary data supplied on input of the logic circuit under the effect of the precharge command signal.

An embodiment also relates to an electronic component comprising a countermeasure device such as that defined above.

An embodiment also relates to a portable device with a microcircuit, characterized in that it comprises an electronic component such as that defined above.

In an embodiment, a method comprises: operating a logic module having a logic gate with an unbalanced probability of generating a binary signal in response to random input data to the logic module by, in a data-processing mode of operation of the logic module, supplying data to process to inputs of the logic module; and in a pre-charge mode of operation of the logic module, modifying the probability of the logic gate generating the binary signal in response to random input data provided to the logic module. In an embodiment, modifying the probability of the logic gate generating the binary signal comprises modifying a functioning of the logic gate of the logic module. In an embodiment, the functioning of the logic gate is modified so that an output signal of the logic gate is in a binary state with a same probability as random binary data supplied on input to the logic module. In an embodiment, modifying the functioning of the logic gate comprises providing determined values to inputs of the logic gate except one input, to change a function of the logic gate into a buffering or inverting function with respect to the one input. In an embodiment, the method comprises providing a multiplexer for each input of the logic gate except the one, each multiplexer connected on output to the respective input of the logic gate and receiving on one input an input data of the logic gate and on another input a determined value, and on a command input a pre-charge mode command signal. In an embodiment, modifying the functioning of the logic gate comprises deactivating the inputs of the logic gate except one, to change a function of the logic gate into a buffering or inverting function with respect to the non-deactivated input. In an embodiment, the method comprises, in response to a pre-charge command mode signal: short-circuiting transistors except one of the logic gate interconnected in series and controlled by the inputs of the logic gate; and disconnecting transistors except one of the logic gate interconnected in parallel and controlled by the inputs of the logic gate. In an embodiment, the logic gate is a gate of an AND, NAND, OR, or NOR type. In an embodiment, the logic module comprises a plurality of logic gates each having an unbalanced probability of generating a binary signal in response to random input data to the logic module, and the method comprises, in the pre-charge mode of operation, modifying functioning of the plurality of logic gates of the logic module so that an output signal of respective logic gates of the plurality is in a binary state with a same probability as random binary data supplied on input to the logic module.

In an embodiment, a logic module comprises: a logic gate having, in a data-processing mode of operation of the logic module, an unbalanced probability of generating a binary signal in response to random input data applied to inputs of the logic module; and a pre-charger coupled to the logic gate and configured to, in a pre-charge mode of operation of the logic module, modify the probability of the logic gate generating the binary signal in response to random input data applied to the logic module. In an embodiment, the pre-charger is configured to, in the pre-charge mode of operation, modify a functioning of the logic gate of the logic module so that an output signal of the logic gate is in a binary state with a same probability as random binary data supplied on input to the logic module. In an embodiment, the pre-charger is configured to, in the pre-charge mode of operation, change a function of the logic gate into a buffering or inverting function with respect to a first input of the logic gate. In an embodiment, the pre-charger is configured to, in the pre-charge mode of operation, provide a determined value to a second input of the logic gate. In an embodiment, the pre-charger comprises a multiplexer with an output coupled to the second input of the logic gate and configured to: in the pre-charge mode of operation, supply the second input of the logic gate with the determined value; and in the data-processing mode of operation, supply the second input of the logic gate with data to be processed by the logic gate. In an embodiment, the pre-charger is configured to, in the pre-charge mode of operation, provide respective determined values to a plurality of other inputs of the logic gate. In an embodiment, the pre-charger comprises respective multiplexers having outputs coupled to respective inputs of the plurality of other inputs of the logic gate and configured to: in the pre-charge mode of operation, supply the respective input of the logic gate with the respective determined value; and in the data-processing mode of operation, supply the respective input of the logic gate with data to be processed by the logic gate. In an embodiment, the pre-charger is configured to, in the pre-charge mode of operation, deactivate at least one input of the logic gate. In an embodiment, the logic gate comprises: a first plurality of transistors coupled together in series and having control nodes coupled to respective inputs of the logic gate; and a second plurality of transistors coupled together in parallel and having control nodes coupled to respective inputs of the logic gate, wherein the pre-charger is configured to, in the pre-charge mode of operation, short-circuit at least one of the first plurality of transistors and disconnect at least one of the second plurality of transistors. In an embodiment, the pre-charger is configured to, in the pre-charge mode of operation, apply a random input signal to at least one of the first plurality of transistors and apply the random input signal to at least one of the second plurality of transistors. In an embodiment, the logic gate is one of an AND, NAND, OR, and NOR type gate. In an embodiment, the logic module comprises a plurality of logic gates each having, in the data-processing mode of operation of the logic module, an unbalanced probability of generating respective binary outputs in response to random input data applied to inputs of the logic module and the pre-charger is coupled to each of the logic gates of the plurality and configured to, in the pre-charge mode of operation of the logic module, modify the probability of each of the logic gates generating the respective binary signal in response to random input data applied to the logic module. In an embodiment, the pre-charger is configured to enter the pre-charge mode of operation in response to a pre-charge command signal. In an embodiment, the logic gate comprises transistors interconnected in series to the output of the logic gate and each controlled by an input of the logic gate, transistors interconnected in parallel to the output of the logic gate and each controlled by an input of the logic gate, and the pre-charger comprises: a transistor controlled by a pre-charge command signal and configured to short-circuit all the transistors interconnected in series except one when the pre-charge command signal is active; and a transistor controlled by the precharge command signal and configured to disconnect all the transistors interconnected in parallel except one when the pre-charge command signal is active.

In an embodiment, a system comprises: at least one logic gate having a plurality of inputs and configured to generate a binary signal with a first probability in response to random input data; and means for pre-charging the at least one logic gate by, in a pre-charge mode of operation, modifying a function of the at least one logic gate so that the at least one logic gate has a second probability, different from the first probability, of generating the binary signal. In an embodiment, the means for pre-charging comprises an OR gate. In an embodiment, the means for pre-charging comprises a multiplexer. In an embodiment, the means for pre-charging comprises means for deactivating at least one input of the logic gate. In an embodiment, the system is a portable device.

BRIEF DESCRIPTION OF THE SEVERAL VIEWS OF THE DRAWINGS

Embodiment examples will be described in the following, in a non-limiting manner in relation with the appended drawings among which.

DETAILED DESCRIPTION

Figure 1:
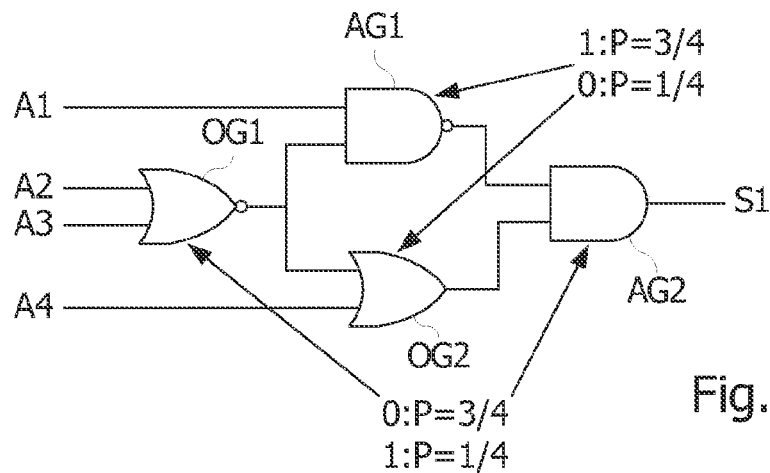
FIG. 1 shows an example logic circuit.

FIG. 1 shows a logic circuit example comprising four logic gates AG1, AG2, OG1, OG2; four inputs A1, A2, A3, A4; and one output S1. The gate OG1 is of the NOR type and is connected on input to inputs A2 and A3. The gate AG1 is of the NAND type and is connected on input to the input A1 and to the output of the gate OG1. The gate OG2 is of the OR type and is connected on input to the input A4 and to the output of the gate OG1. The gate AG2 is of the AND type and is connected on input to the outputs of the gates AG1 and OG2, and on output to the output S1 of the logic circuit. If random data (having a ½ probability of being equal to 0 or 1) are applied to the inputs A1-A4, the output of gates OG1 and AG2 are 0 with a probability of ¾ and to 1 with a probability of ¼.

The output of gates OG2 and AG1 is 1 with a probability of ¾ and is 0 with a probability of ¼. It results that the outputs of gates AG1 and OG2 will be 1 with a probability of ⅞ and at 0 with a probability of ⅛. The output S1 of the circuit will therefore be 0 with a probability of $^{15}/_{64}$ and 1 with a probability of $^{49}/_{64}$.

Figure 2:
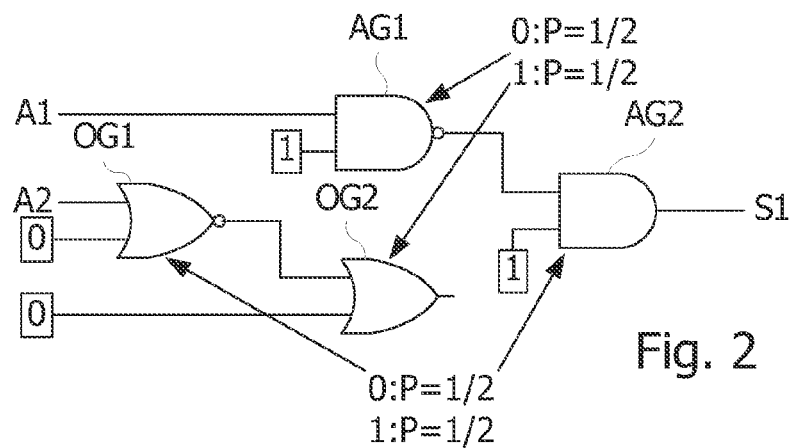
FIG. 2 shows the logic circuit of FIG. 1, according to an embodiment.

FIG. 2 shows the logic circuit of FIG. 1, protected against SPA, DPA, and EMA attacks. This may be done by forcing, during a precharge phase before a processing phase, all the inputs except one of each statistically unbalanced logic gate to a value such that the gate performs for the non-forced input a buffer or inverter function. In this manner, the output of each gate has a probability of ½ to be at 0 or 1 when a random value having this probability of being at 0 or 1 is supplied to the non-forced input of the gate. Thus, in the example of FIG. 2, an input of the NAND type AG1 and of the AND type AG1 logic gates is forced to one, and an input of the OR type OG1 and of the NOR type OG2 logic gates is forced to 0. Instead of supplying four random values to the inputs A1 to A4 during the precharge phase, the inputs A3 and A4 are set to 0, and binary data of random value (with a probability of ½ to be at 0 or 1) are supplied to the inputs A1 and A2 of the logic circuit. The output of each of the gates OG1, OG2, AG1, AG2 therefore has a probability of ½ to be set to 0 or 1.

Figure 3A:
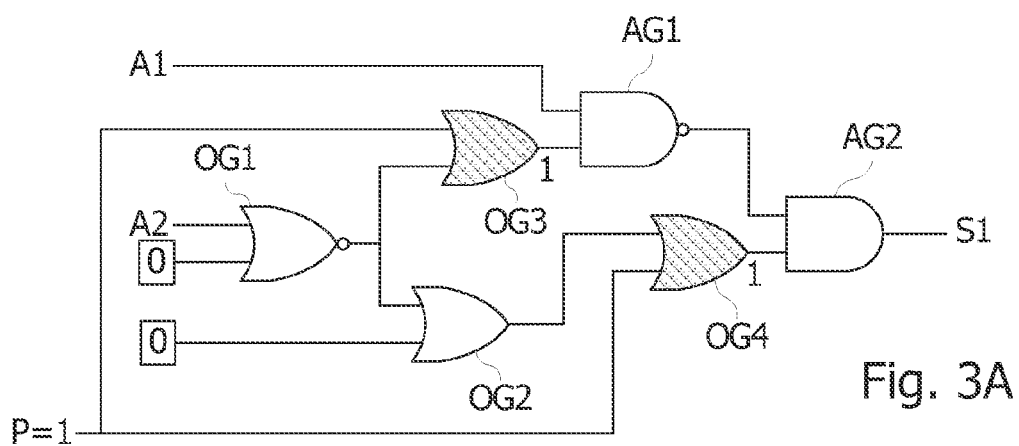
FIGS. 3A, 3B show the logic circuit of FIG. 1, according to another embodiment, in a precharge phase and in a processing phase.
Figure 3B:
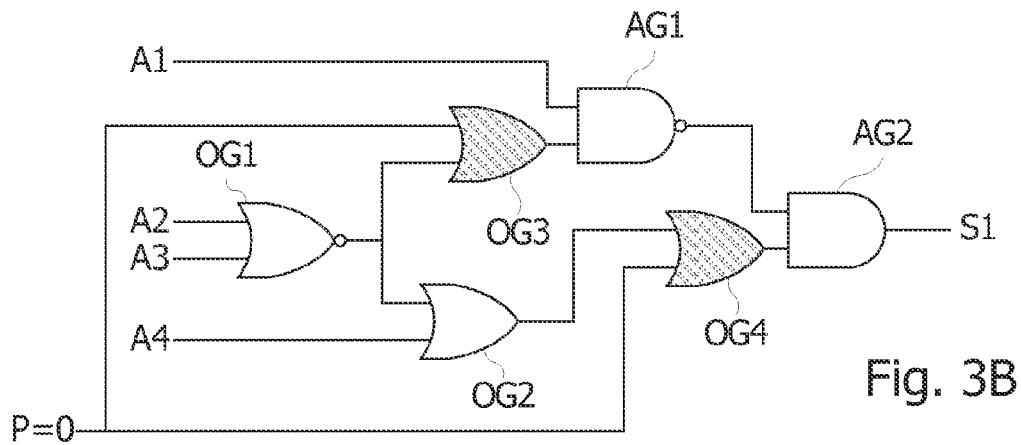

In order to force gate inputs that are not accessible on input of the logic circuit, it suffices to provide multiplexers or supplementary gates as shown in FIGS. 3A and 3B. FIGS. 3A, 3B thus show an embodiment of the logic circuit that differs from that of FIG. 1 in that it comprises a gate OG3 of the OR type connected between the gates OG1 and AG1, and a gate OG4 of OR type connected between the gates OG2 and AG2. During the precharge phase shown in FIG. 3A, an input of each of the gates OG3 and OG4 is forced to 1. In this manner, the output of gates OG3 and OG4 are at 1 during the precharge phase, which allows an input of gates AG1 and AG2 to be forced to 1. During a processing phase, shown in FIG. 3B, the input forced to 1 of gates OG3 and OG4 is set at 0, in manner so as to render these gates transparent. The supplementary gates OG3, OG4 will therefore change state during the processing phase if the outputs of the gates OG1, OG2 respectively are at 0. It results that the gates OG3 and OG4 will not change state if the data to process supplied to the inputs A2 and A3 are both at 0. The gate OG3 will change state if the input A2 and A3 are not both at 0. The gate OG4 will change state if the gate OG3 changes state and if the input A3 is at 0. Consequently, the added logic gates can supply information about the data to process supplied on input of the logic circuit.

Figure 4A:
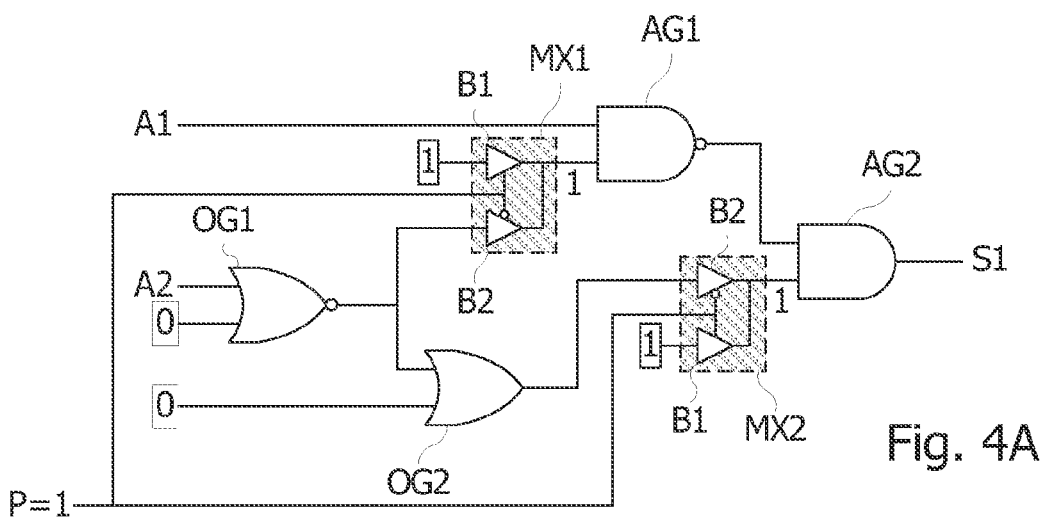
FIGS. 4A, 4B show the logic circuit of FIG. 1, according to another embodiment, in a precharge phase and in a processing phase.
Figure 4B:
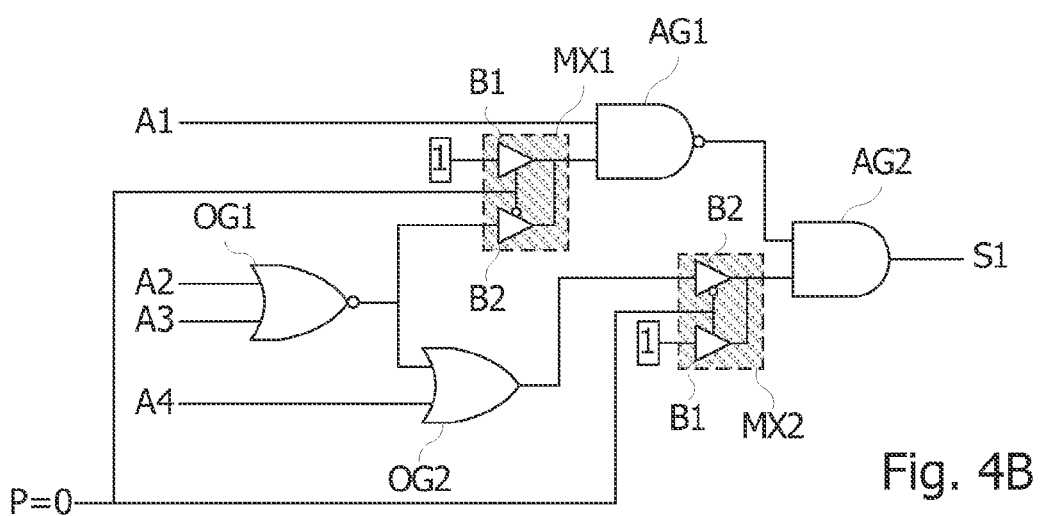

FIGS. 4A, 4B show another embodiment of a logic circuit. The logic circuit shown in the figure differs from that of FIG. 3 in that the supplementary gates OG3 and OG4 are replaced by multiplexers with two inputs MX1, MX2 receiving on one control input the precharge command signal P. Each multiplexer MX1, MX2 comprises two buffer gates B1, B2 with three states (tri-state buffer) each comprising a data input, an activation control input, and one output. The activation input of the gate B2 of each multiplexer MX1, MX2 is inverted, whereas that of the gate B1 is not inverted. The command input of each multiplexer MX1, MX2 is connected to activation inputs of the two gates B1, B2. The input of the gate B2 of multiplexer MX1 is connected to the output of the gate OG1, and the input of the gate B1 of multiplexer MX1 is forced to 1. The outputs of gates B1, B2 of multiplexer MX1 are connected to an input of the gate AG1. The input of the gate B2 of multiplexer MX2 is connected to the output of the gate OG2, and the input of the gate B1 of multiplexer MX2 is forced to 1. The outputs of gates B1, B2 of multiplexer MX2 are connected to an input of the gate AG2. In this manner, a single gate B1, B2 of each of the two multiplexers MX1, MX2 is active while the other has an output at high impedance. In the precharge phase shown in FIG. 4A, the command input of each of the two multiplexers MX1, MX2 is set at 1. In this manner, the gates B1 of multiplexers MX1, MX2 are active and the gates B2 are inactive. The multiplexers thus force one input of each of the gates AG1, AG2 to 1. In the processing phase shown in FIG. 4B, the command input P of each of the two multiplexers MX1, MX2 is set at 0. The multiplexers MX1, MX2 thus link the output of the gate OG1 to the input of the gate AG1, and the output of the gate OG2 to the input of the gate AG2. Therefore, when the data to process propagate through the logic circuit at the end of the precharge phase, the gates B1, B2 in the multiplexers MX1, MX2 systematically change states, that is to say independently of the values of the data to process.

Evidently, a multiplexer with two inputs can be used to force an input of an AND or NAND gate to 0, by setting the input of the gate B1 to 0. It should be noted that the roles of gates B1, B2 in the multiplexers MX1, MX2, may be switched. In the precharge phase, the gates B2 are used to force an input of the logic gate in, and in the processing phase the gates B1 are used to transmit to this input a data developed in a previous logic gate. In this case, the control input of the multiplexers is set at 0 during the precharge phase and at 1 during the processing phase.

In the logic circuits of FIGS. 2 to 4B, it may be provided to force the input A1 to 1 and to conserve the link between the output of the gate OG1 and the input of the gate AG1, during the precharge phase. A single random data is thus supplied to the input A2 of the circuit during the precharge phase. It results that in the example of FIG. 3, the supplementary gate OG3 is optional. In the example of FIG. 4, the multiplexer MX1 is also optional.

Figure 5:
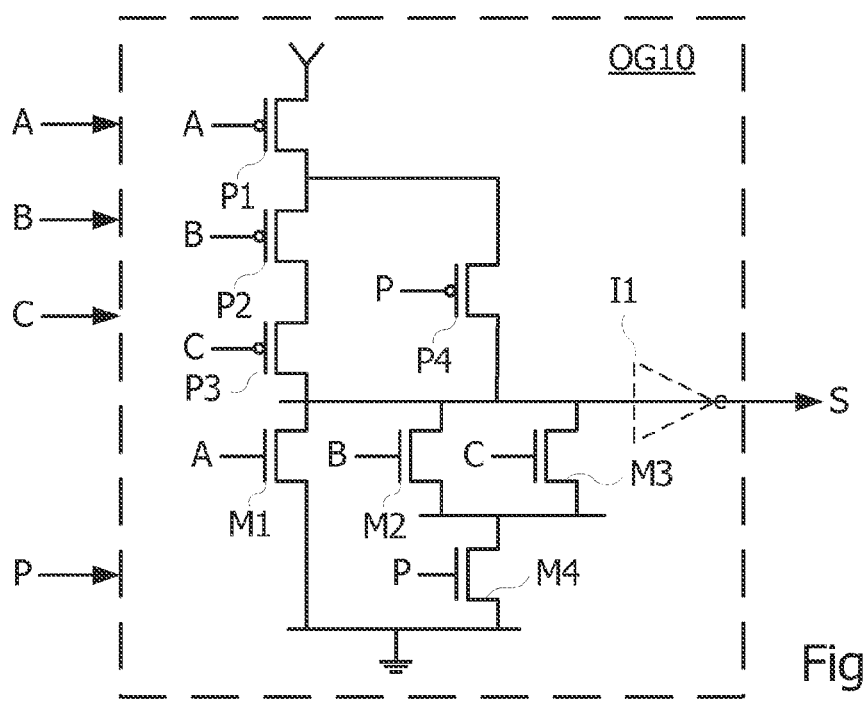
FIGS. 5 and 6 show logic gates according to an embodiment.

In the preceding description, a statistical balancing of logic gates of a logic circuit has been done by adding supplementary gates to the logic circuit on input of the logic gates to balance. Such a statistical balancing can also be done by modifying each logic gate to balance. Thus, FIG. 5 shows an embodiment of a logic gate of the NOR type with three inputs A, B, C, modified to obtain such a statistical balancing. In FIG. 5, the logic gate OG10 comprises three transistors of PMOS type P1, P2, P3 connected in series between the power supply source and the output S of the gate, and three transistors of the NMOS type M1, M2, M3 connected to the output S of the gate. Input A is connected to the gates of transistors P1 and M1, the input B to the gates of transistors P2 and M2, and input C to the gates of transistors P3 and M3. The drain of transistor P1 receives the supply voltage of the gate OG10. The source of transistor P1 is connected to the drain of transistor P2, and the source of transistor P2 is connected to the drain of transistor P3. The source of transistor P3 is connected to the output S of the gate OG10. The sources of transistors M1, M2, M3 are connected to the output S. The drain of transistor M1 is connected to ground.

According to an embodiment, the gate OG10 comprises a supplementary input provided to receive a precharge command signal P of the logic gate, and two supplementary transistors P4, M4 of PMOS and NMOS types, receiving the signal P on their gates. The transistor P4 allows, in precharge phase, to short-circuit all the transistors P2, P3 of the gate connected in series except one (P1), and the transistor M4 allows to disconnect all the transistors M2, M3 of the gate connected in parallel except one (M1). To this end, the drain of transistor P4 is connected to the source of transistor P1, and the source of transistor P4 is connected to the output S. The source of transistor M4 is connected to the drains of transistors M2 and M3, and the drain of transistor M4 is connected to ground.

When the input P receives a precharge signal of 0, the transistor P4 is conducting, linking the source of transistor P1 directly to the output S of the gate OG10 and short-circuiting the transistors P2 and P3. The transistor M4 is non-conducting. The transistors M2 and M3 are thus disconnected. The gate OG10 thus acts like an inverter having A for input and S for output. The inputs B and C are thus rendered inactive. If the input A receives a random data (with a probability of ½ to be at 0 or 1), the output S of the gate will have a probability of ½ to be at 0 or 1. It results that the gate OG10 during the precharge phase is statistically balanced. During the processing phase, the signal P is set at 1. The transistor P4 is therefore non-conducting and the transistor M4 is conducting. The gate OG10 thus performs the function of a NOR type gate with three inputs A, B, C.

It is to be noted that a gate with two inputs, for example A, B, can be easily obtained by replacing the transistor P3 with a simple electrical link and by removing the transistor M3. Inversely, a gate with more than three inputs may be obtained by adding PMOS type transistors in series with the transistors P2, P3 between the source of transistor P3 and the output S, and by adding NMOS type transistors in parallel with the transistors M2, M3.

Figure 6:
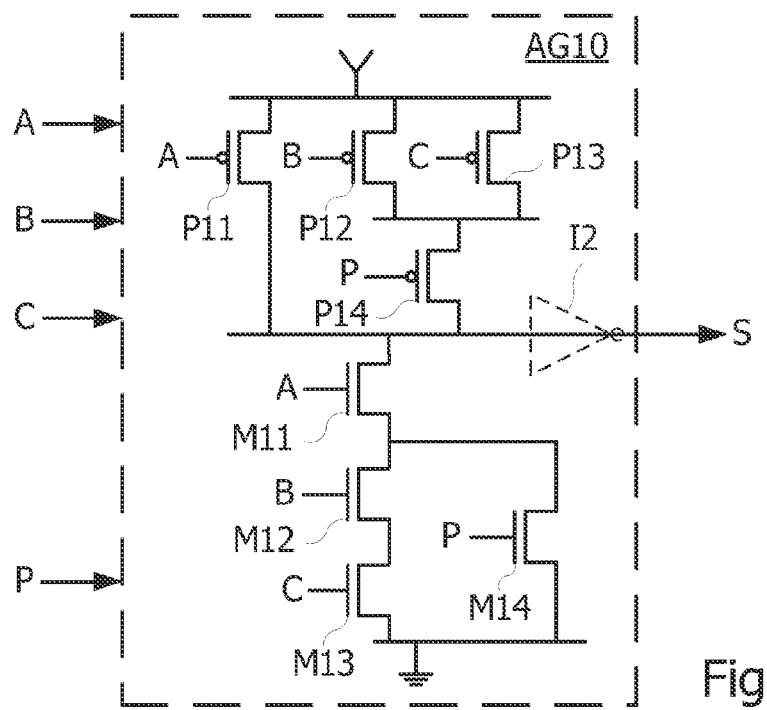

FIG. 6 shows a logic gate of the NAND type with three inputs A, B, C, modified to be able to be statistically balanced during a precharge phase. In FIG. 6, the logic gate AG10 comprises three PMOS type transistors P11, P12, P13 connected to the power supply source, and three NMOS type transistors M11, M12, M13 connected in series between the output S of the gate and ground. The input A is connected to the gates of transistors P11 and M11, the input B to the gates of transistors P12 and M12, and the input C to the gates of transistors P13 and M13. The drain of each of the transistors P11, P12, P13 receives the supply voltage of the gate AG10. The source of transistor P11 is connected to the output S of the gate AG10. The source of transistor M11 is connected to the output S. The drain of transistor M11 is connected to the source of transistor M12. The drain of transistor M12 is connected to the source of transistor M13. The drain of transistor M13 is connected to ground.

According to an embodiment, the gate AG10 comprises a supplementary input provided to receive a precharge command signal P of the logic gate, and two supplementary transistors P14, M14 of the PMOS and NMOS types, receiving the signal P on their gates. The transistor P14 allows, in precharge phase, to disconnect all the transistors connected in parallel P12, P13 of the gate except one (P11), and the transistor M4 allows to short-circuit all the transistors M12, M13 connected in series of the gate except one (M11). To this end, the drain of transistor P14 is connected to the source of each of the transistors P12 and P13, and the source of transistor P14 is connected to the output S. The source of transistor M14 is connected to the drain of transistor M11 and to the source of transistor M12. The drain of transistor M14 is connected to ground.

When the input P receives a precharge signal of 1, the transistor P14 is non-conducting, and the transistor M14 is conducting. Only the source of transistor P11 is thus linked to the output S of the gate AG10. The transistors P12 and P13 are thus disconnected. The drain of transistor M11 is linked to ground and the transistors M12 and M13 are short-circuited. The gate AG10 therefore acts like an inverter having A for input and S for output. The inputs B and C are thus rendered inactive. If the input A receives a random data (with a probability of ½ to be at 0 or 1), the output S of the gate will have a probability of ½ to be at 0 or 1. It results that the gate AG10 in precharge phase is statistically balanced. In processing phase, the signal P is at 0. The transistor P14 is therefore conducting and the transistor M14 is non-conducting. The gate AG10 thus performs the function of a NAND type gate with three inputs A, B, C.

It is to be noted that a gate with two inputs, for example A, B, can be easily obtained by deleting the transistor P13 and by replacing the transistor M13 with a simple electrical link. Inversely, a gate with more than three inputs can be obtained by adding PMOS transistors in parallel with the transistors P12, P13, and by adding NMOS transistors in series with the transistors M12, M13, between the transistor M13 and ground.

A logic gate of the OR type may be easily obtained from the gate OG10 (FIG. 5) by adding an inverter I1 to the output S of the gate. Similarly, a logic gate of the AND type can be realized from the gate AG10 (FIG. 6) by adding an inverter I2 to the output S of the gate. The presence of such an inverter does not modify the statistical balance of the gates OG10, AG10 during precharge phase.

Figure 7:
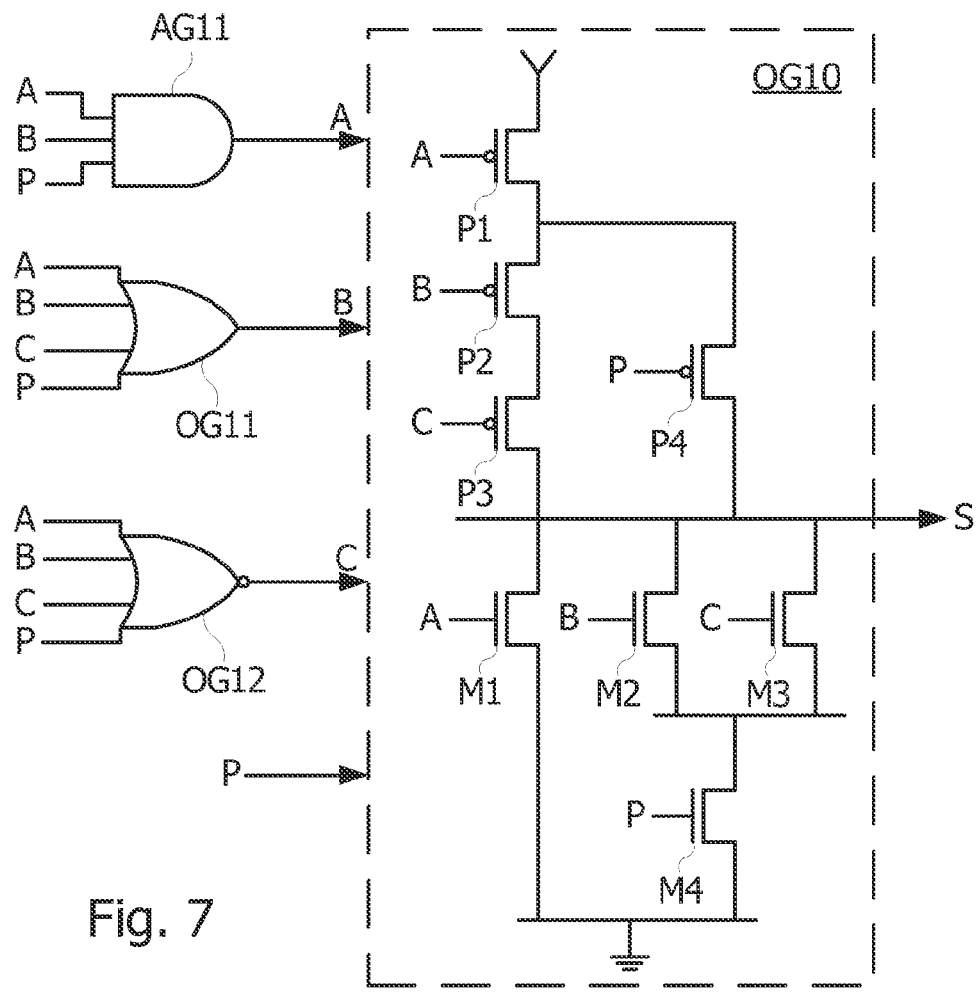
FIG. 7 shows a logic circuit comprising logic gates according to an embodiment.

FIG. 7 shows a logic circuit comprising the logic gate OG10 and logic gates OG11, OG12, AG11, modified for example as shown in FIGS. 5 and 6, in order that they each comprise a command input for the precharge P, allowing to change the gate in precharge phase into a statistically-balanced gate. The outputs of gates AG11, OG11, OG12 are respectively connected to the inputs A, B, C of the gate OG10. During the precharge phase, the input P of each gate is activated and random data (with a probability of ½ to be at 0 or 1) are supplied to the inputs A of gates AG11, OG11 and OG12. The gate AG11 thus supplies a random data, with a probability of ½ to be at 0 or 1, on the input A of the gate OG10. This random data will propagate through the gate OG10 until the output S of this gate. The output S of the gate OG10 thus finds itself with a probability of ½ to be at 0 or 1. The gates OG11 and OG12 also supply random data on the inputs B and C of the gate OG10. In precharge phase, the inputs B and C of the gate OG10 are inactive, the random data at the inputs B and C therefore do not modify the output S of the gate OG10. Nevertheless, from an electric standpoint, these random data can change the state of the transistors P2, P3, M2, M3, and thus mask the switchings. At the end of the precharge phase, the inputs P of each gate are deactivated.

In summary, the forcing to 0 or 1 of all inputs except one of a logic gate (FIGS. 2 to 4) during a precharge phase, or the adaptation of the logic gate done in FIGS. 5 and 6 allows to change, during the precharge phase, an unbalanced logic gate into a buffer gate or an inverter that is statistically balanced.

Figure 8:
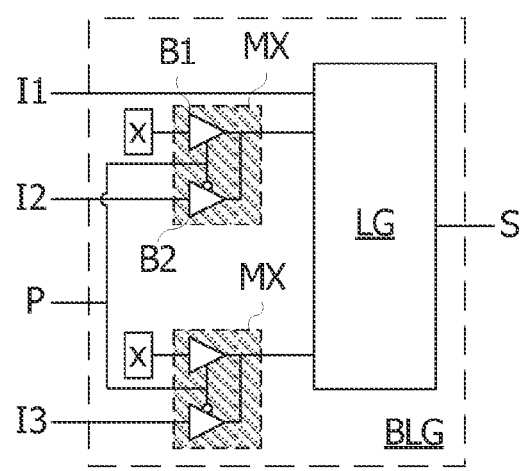
FIG. 8 shows a logic gate according to another embodiment.

A logic circuit presenting a precharge mode wherein all or some of the logic gates are statistically balanced can be easily obtained by using a logic gate library wherein statistically unbalanced logic gates are replaced by logic gates such as those shown in FIGS. 5 and 6, or in FIG. 8. FIG. 8 shows a logic gate BLG, made from a statistically unbalanced logic gate LG, having a precharge mode wherein the gate is statistically balanced. The gate BLG comprises an output S connected to the output of the gate LG, and a first input I1 connected to a first input of the gate LG. All the inputs I2, I3 of the gate BLG, except the first input I1, are linked to a corresponding input of the gate LG, by the intermediary of a respective multiplexer MX that may be identical to those of FIGS. 4A, 4B. Each multiplexer MX is commanded by the precharge command signal P. An input of each multiplexer MX is forced to a value x equal to 0 or 1 according the type of gate LG. In this manner, all the inputs except one (the input I1) are forced to the value x when the precharge signal P is active.

It will clearly appear to the skilled person that the present disclosure is susceptible of various embodiments. In particular, the disclosure is not limited to the changing, during a precharge phase, of a statistically-unbalanced logic gate into a buffer gate or an inverter. Indeed, the precharge signal can allow to change the gate into a balanced gate of another type, such as a direct or inverted XOR, or into an unbalanced gate of another type having a different statistical balance.

It is also not necessary to modify all the statistically unbalanced logic gates of a logic circuit. In fact, it suffices that certain gates of the logic circuit, for example the gates directly receiving the input data of the logic circuit, be modified to disturb a statistical analysis of observed results, notably following attacks of the SDA type.

The various embodiments described above can be combined to provide further embodiments. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
 operating a logic module having a logic gate with an unbalanced probability of generating a binary signal in response to random input data to the logic module by,
  in a data-processing mode of operation of the logic module, supplying data to process to inputs of the logic module; and
  in a pre-charge mode of operation of the logic module, modifying a function of the logic gate into one of a buffering function and an inverting function with respect to a data input of the logic gate.

2. The method of claim 1 wherein the modifying the function of the logic gate comprises modifying the function of the logic gate into an inverting function with respect to the data input.

3. The method of claim 1 wherein the functioning of the logic gate is modified so that an output signal of the logic gate is in a binary state with a same probability as random binary data supplied on input to the logic module.

4. The method according to claim 1 wherein modifying the functioning of the logic gate comprises providing determined values to one or more other data inputs of the logic gate.

5. The method according to claim 4, comprising providing a multiplexer for each of the other data inputs of the logic gate, each multiplexer connected on output to the respective input of the logic gate and receiving on one input an input data of the logic gate and on another input a determined value.

6. The method according to claim 1 wherein modifying the functioning of the logic gate comprises deactivating one or more other data inputs of the logic gate.

7. The method according to claim 6 comprising, in response to a pre-charge command mode signal:
 short-circuiting transistors except one of the logic gate interconnected in series and controlled by the inputs of the logic gate; and disconnecting transistors except one of the logic gate interconnected in parallel and controlled by the inputs of the logic gate.

8. The method according to claim 1 wherein the logic gate is a gate of an AND, NAND, OR, or NOR type.

9. The method according to claim 1 wherein the logic module comprises a plurality of logic gates each having an unbalanced probability of generating a binary signal in response to random input data to the logic module, and the method comprises, in the pre-charge mode of operation, modifying functioning of the plurality of logic gates of the logic module so that an output signal of respective logic gates of the plurality is in a binary state with a same probability as random binary data supplied on input to the logic module.

10. A logic module, comprising:
a logic gate having, in a data-processing mode of operation of the logic module, an unbalanced probability of generating a binary signal in response to random input data applied to inputs of the logic module; and
a pre-charger coupled to the logic gate and configured to, in a pre-charge mode of operation of the logic module, modify a function of the logic gate into one of a buffering function and an inverting function with respect to a first input of the logic gate.

11. The logic module of claim 10 wherein the pre-charger is configured to, in the pre-charge mode of operation, provide a determined value to a second input of the logic gate.

12. The logic module of claim 11 wherein the pre-charger comprises a multiplexer with an output coupled to the second input of the logic gate and configured to:
in the pre-charge mode of operation, supply the second input of the logic gate with the determined value.

13. The logic module of claim 10 wherein the pre-charger is configured to, in the pre-charge mode of operation, provide respective determined values to a plurality of other inputs of the logic gate.

14. The logic module of claim 13 wherein the pre-charger comprises respective multiplexers having outputs coupled to respective inputs of the plurality of other inputs of the logic gate and configured to:
in the pre-charge mode of operation, supply the respective input of the logic gate with the respective determined value.

15. The logic module of claim 10 wherein the logic gate is one of an AND, NAND, OR, and NOR type gate.

16. The logic module of claim 10 wherein the logic module comprises a plurality of logic gates each having, in the data-processing mode of operation of the logic module, an unbalanced probability of generating respective binary outputs in response to random input data applied to inputs of the logic module and the pre-charger is coupled to each of the logic gates of the plurality and configured to, in the pre-charge mode of operation of the logic module, modify the probability of each of the logic gates generating the respective binary signal in response to random input data applied to the logic module.

17. The logic module of claim 10 wherein the pre-charger is configured to enter the pre-charge mode of operation in response to a pre-charge command signal.

18. The logic module according to claim 10 wherein the logic gate comprises transistors interconnected in series and each controlled by an input of the logic gate, transistors interconnected in parallel and each controlled by an input of the logic gate, and the pre-charger comprises:
a transistor controlled by a pre-charge command signal and configured to short-circuit all the transistors interconnected in series except one when the pre-charge command signal is active; and
a transistor controlled by the pre-charge command signal and configured to disconnect all the transistors interconnected in parallel except one when the pre-charge command signal is active.

19. A system, comprising:
at least one logic gate having a plurality of inputs and configured to generate a binary signal with a first probability in response to random input data; and
means for pre-charging the at least one logic gate by, in a pre-charge mode of operation, modifying a function of the at least one logic gate into one of a buffering function and an inverting function with respect to an input of the logic gate.

20. The system of claim 19 wherein the logic gate comprises a plurality of transistors and the means for pre-charging comprises means for short-circuiting at least one transistor of the plurality and means for disconnecting at least one transistor of the plurality.

* * * * *